United States Patent
Huang

(10) Patent No.: US 10,521,029 B1
(45) Date of Patent: Dec. 31, 2019

(54) TOUCH PAD MODULE AND COMPUTING DEVICE USING SAME

(71) Applicant: PRIMAX ELECTRONICS LTD., Taipei (TW)

(72) Inventor: Tai-Sou Huang, Taipei (TW)

(73) Assignee: PRIMAX ELECTRONICS LTD., Taipei (TW)

(*) Notice: Subject to any disclaimer, the term of this patent is extended or adjusted under 35 U.S.C. 154(b) by 0 days.

(21) Appl. No.: 16/218,583

(22) Filed: Dec. 13, 2018

(30) Foreign Application Priority Data

Oct. 12, 2018  (TW) .............................. 107136042 A

(51) Int. Cl.
| | |
|---|---|
| *G06F 3/0354* | (2013.01) |
| *G06F 1/16* | (2006.01) |
| *H05K 1/02* | (2006.01) |
| *H03K 17/96* | (2006.01) |

(52) U.S. Cl.
CPC ........ *G06F 3/03547* (2013.01); *G06F 1/1692* (2013.01); *H03K 17/96* (2013.01); *H05K 1/0213* (2013.01)

(58) Field of Classification Search
CPC ... G06F 3/03547; G06F 1/1692; H03K 17/96; H05K 1/0213
See application file for complete search history.

(56) References Cited

U.S. PATENT DOCUMENTS

| | | | |
|---|---|---|---|
| 2007/0139388 A1* | 6/2007 | Lee .................. | G06F 1/1616 345/173 |
| 2014/0111914 A1* | 4/2014 | Leggett ............. | G06F 1/182 361/679.1 |
| 2014/0139442 A1* | 5/2014 | Clayton ............. | G06F 3/03547 345/173 |

* cited by examiner

*Primary Examiner* — Stacy Khoo
(74) *Attorney, Agent, or Firm* — WPAT, PC

(57) ABSTRACT

A touchpad module includes a circuit board, a switch and a conductive raised structure. The circuit board includes a first conducting part and a second conducting part. The switch is installed on the circuit board. The switch includes a metal dome. The metal dome includes a first portion corresponding to the first conducting part and a second portion corresponding to the second conducting part. When the metal dome is subjected to deformation, the first portion of the metal dome is contacted with the first conducting part. The conductive raised structure is arranged between the second conducting part and the second portion of the metal dome. Since a gap is formed between the circuit board and the second portion of the metal dome, the contact area between the metal dome and the circuit board is reduced. Consequently, the generated noise is reduced.

13 Claims, 9 Drawing Sheets

TOUCH PAD MODULE AND COMPUTING DEVICE USING SAME

FIELD OF THE INVENTION

The present invention relates to an input device, and more particularly to an input device with a touch control function.

BACKGROUND OF THE INVENTION

With increasing development of science and technology, a variety of electronic devices are designed in views of convenience and user-friendliness. For helping the user well operate the electronic devices, the electronic devices are gradually developed in views of humanization. The common electronic devices include for example notebook computers, mobile phones, satellite navigation devices, or the like. Recently, the storage capacity and the processor's computing performance for these electronic devices are largely enhanced, and thus their functions become more powerful and complicated. For efficiently operating an electronic device, a touchpad is used as an input device of the electronic device for controlling the operations of the electronic device.

FIG. 1 schematically illustrates a conventional notebook computer with a touchpad module. As shown in FIG. 1, the touchpad module 1 is installed on a casing 21 of the notebook computer 2. Moreover, at least a portion of the touchpad module 1 is exposed outside so as to be touched by the user's finger. Consequently, the user may operate the touchpad module 1 to control the notebook computer 2. For example, in case that the user's finger is placed on the touchpad module 1 and slid on the touchpad module 1, a cursor 23 shown on a display screen 22 of the notebook computer 2 is correspondingly moved. Moreover, in case that the touchpad module 1 is pressed down by the user's finger, the notebook computer 2 executes a specified function. The use of the touchpad module 1 can implement some functions of the conventional mouse. In other words, the user may operate the notebook computer 2 through the touchpad module 1 without the need of additionally carrying or installing the mouse.

FIG. 2 is a schematic cross-sectional view illustrating the touchpad module as shown in FIG. 1, in which the touchpad module is not pressed down. FIG. 3 is a schematic cross-sectional view illustrating the touchpad module as shown in FIG. 2, in which the touchpad module is pressed down. FIG. 4 is a schematic cross-sectional view illustrating portions of a circuit board and a switch of the touchpad module as shown in FIG. 2, in which the touchpad module is not pressed down. FIG. 5 is a schematic cross-sectional view illustrating portions of the circuit board and the switch of the touchpad module as shown in FIG. 3, in which the touchpad module is pressed down. As shown in FIGS. 2, 3, 4 and 5, a fixing frame 24 is concavely formed in the casing 21 of the notebook computer 2. A supporting structure 241 and a triggering part 242 are respectively protruded from two opposite sides of an inner wall of the fixing frame 24. A first end 11 of the touchpad module 1 is connected with the supporting structure 241. Consequently, a second end 12 of the touchpad module 1 may be swung relative to the triggering part 242 by using the supporting structure 241 as a fulcrum.

The touchpad module 1 further comprises a switch 13 and a circuit board 14. The switch 13 is located under the second end 12 of the touchpad module 1 and aligned with the triggering part 242. The switch 13 comprises a metal dome 131. A first conducting part 141 and a second conducting part 142 corresponding to the metal dome 131 are disposed on the circuit board 14. The first conducting part 141 and the second conducting part 142 are separated from each other by a spacing distance. When the touchpad module 1 is not pressed down, the metal dome 131 is not subjected to deformation. Meanwhile, as shown in FIG. 4, the metal dome 131 is contacted with the second conducting part 142 but not contacted with the first conducting part 141.

While the touchpad module 1 is pressed down by the user, the second end 12 of the touchpad module 1 is swung downwardly relative to the triggering part 242 by using the supporting structure 241 as a fulcrum. When the switch 13 of the touchpad module 1 is pushed by the triggering part 242 of the fixing frame 24, the metal dome 131 is subjected to deformation. At the same time, the metal dome 131 is contacted with both of the first conducting part 141 and the second conducting part 142 (see FIG. 5), and the electric connection between the first conducting part 141 and the second conducting part 142 is established. Under this circumstance, the switch 13 is triggered to generate a switch signal to the notebook computer 2. According to the switch signal, the notebook computer 2 executes a corresponding function. When the touchpad module 1 is no longer pressed by the user, the second end 12 of the touchpad module 1 is swung upwardly relative to the triggering part 242 in response to the elastic force of the metal dome 131 and/or the elastic force of the supporting structure 241. Consequently, the metal dome 131 is restored to its original shape (see FIG. 4) and the touchpad module 1 is returned to its original position.

However, the conventional touchpad module 1 still has some drawbacks. For example, while the touchpad module 1 is pressed down by the user, the deformed metal dome 131 is contacted with the first conducting part 141 and also contacted with the circuit board 14. Due to the click collision between the deformed metal dome 131 and the large-area circuit board 14, unpleasant noise is generated.

Therefore, there is a need of providing an improved touchpad module in order to overcome the above drawbacks.

SUMMARY OF THE INVENTION

A first object of the present invention provides a touchpad module. The touchpad module is equipped with a conductive raised structure between a circuit board and a switch. Consequently, a gap is formed between a metal dome of the switch and the circuit board. While the metal dome is subjected to deformation, the contact area between the metal dome and the circuit board is reduced. Consequently, the generated noise is reduced, and the comfort of operating the touchpad module is enhanced.

A second object of the present invention provides a computing device with a touchpad module. The touchpad module is equipped with a conductive raised structure between a circuit board and a switch. Consequently, a gap is formed between a metal dome of the switch and the circuit board. While the metal dome is subjected to deformation, the contact area between the metal dome and the circuit board is reduced. Consequently, the generated noise is reduced, and the comfort of operating the touchpad module is enhanced.

The other objects and advantages of the present invention will be understood from the disclosed technical features.

In accordance with an aspect of the present invention, there is provided a touchpad module. The touchpad module includes a circuit board, a switch and a conductive raised structure. The circuit board includes a first conducting part and a second conducting part. The second conducting part is arranged around the first conducting part. The first conducting part and the second conducting part are not in contact with each other. The switch is installed on the circuit board. The switch includes a metal dome. The metal dome includes a first portion corresponding to the first conducting part and a second portion corresponding to the second conducting part. When the switch is pushed by a triggering part, the metal dome is subjected to deformation and the first portion of the metal dome is contacted with the first conducting part, so that the first conducting part and the second conducting part are electrically connected with each other. The conductive raised structure is disposed on the circuit board and arranged between the second conducting part and the second portion of the metal dome. Consequently, a gap is formed between the circuit board and the second portion of the metal dome. The gap is in a range between 0.1 millimeter and 0.5 millimeter.

In accordance with another aspect of the present invention, there is provided a computing device. The computing device includes a casing, a processor and a touchpad module. The fixing frame is concavely formed in the casing. The processor is disposed within the casing. The touchpad module is disposed within the casing and electrically connected with the processor. The touchpad module includes a circuit board, a switch and a conductive raised structure. The circuit board includes a first conducting part and a second conducting part. The second conducting part is arranged around the first conducting part. The first conducting part and the second conducting part are not in contact with each other. The switch is installed on the circuit board. The switch includes a metal dome. The metal dome includes a first portion corresponding to the first conducting part and a second portion corresponding to the second conducting part. When the switch is pushed by a triggering part, the metal dome is subjected to deformation and the first portion of the metal dome is contacted with the first conducting part, so that the first conducting part and the second conducting part are electrically connected with each other. The conductive raised structure is disposed on the circuit board and arranged between the second conducting part and the second portion of the metal dome. Consequently, a gap is formed between the circuit board and the second portion of the metal dome. The gap is in a range between 0.1 millimeter and 0.5 millimeter.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
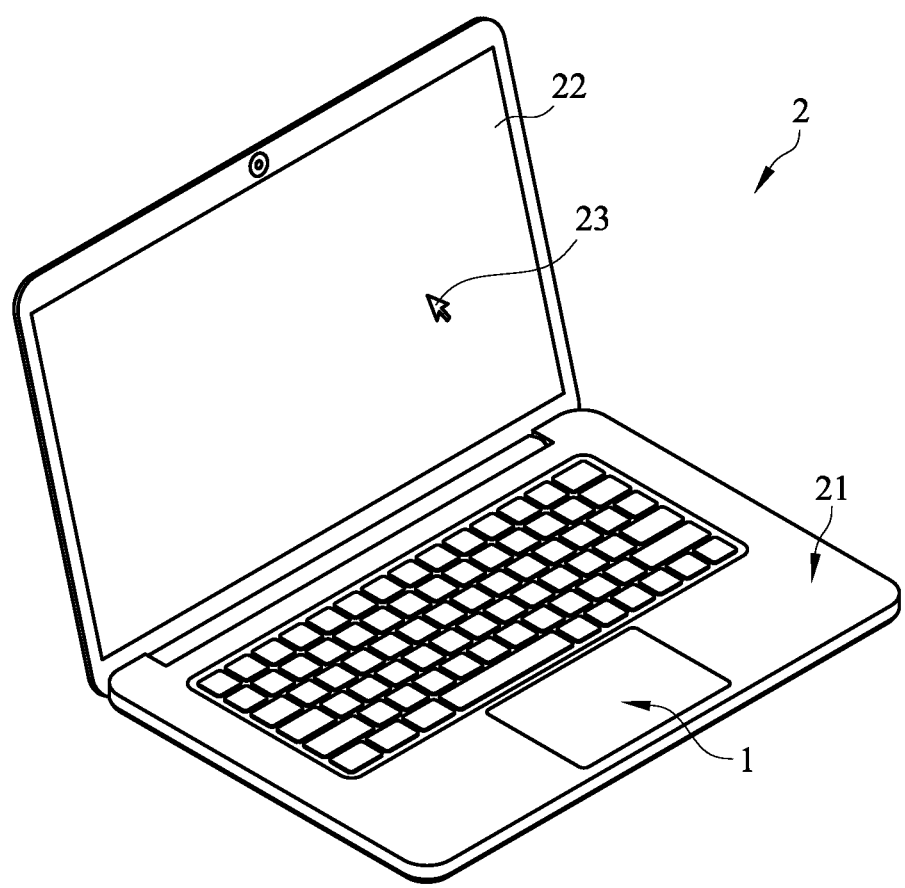
FIG. 1 schematically illustrates a conventional notebook computer with a touchpad module.
Figure 2:
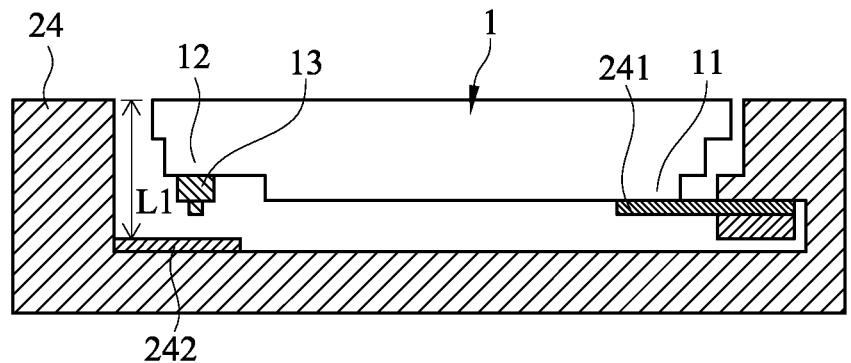
FIG. 2 is a schematic cross-sectional view illustrating the touchpad module as shown in FIG. 1, in which the touchpad module is not pressed down.
Figure 3:
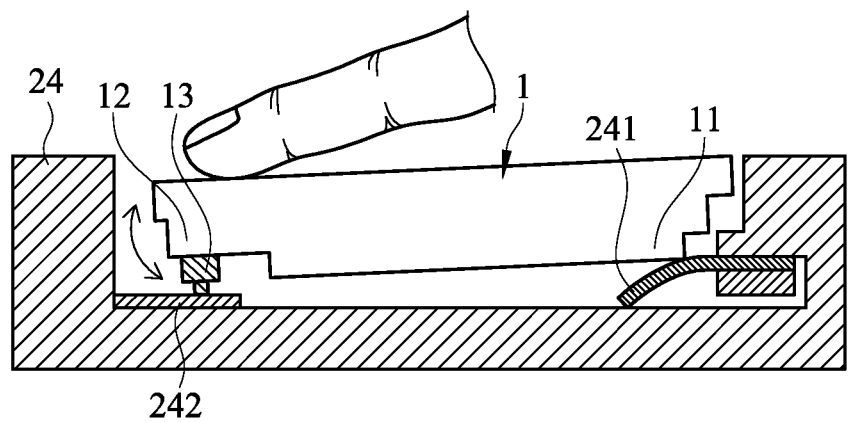
FIG. 3 is a schematic cross-sectional view illustrating the touchpad module as shown in FIG. 2, in which the touchpad module is pressed down.
Figure 4:
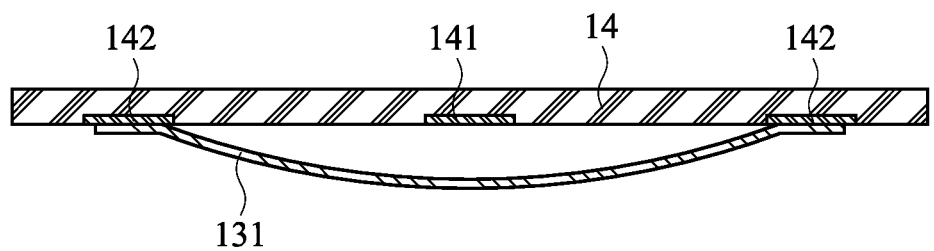
FIG. 4 is a schematic cross-sectional view illustrating portions of a circuit board and a switch of the touchpad module as shown in FIG. 2, in which the touchpad module is not pressed down.
Figure 5:
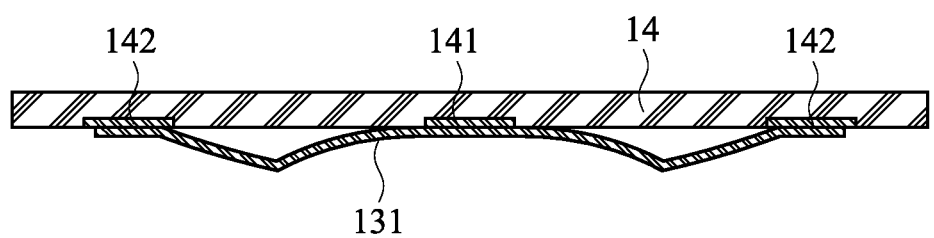
FIG. 5 is a schematic cross-sectional view illustrating portions of the circuit board and the switch of the touchpad module as shown in FIG. 3, in which the touchpad module is pressed down.
Figure 6:
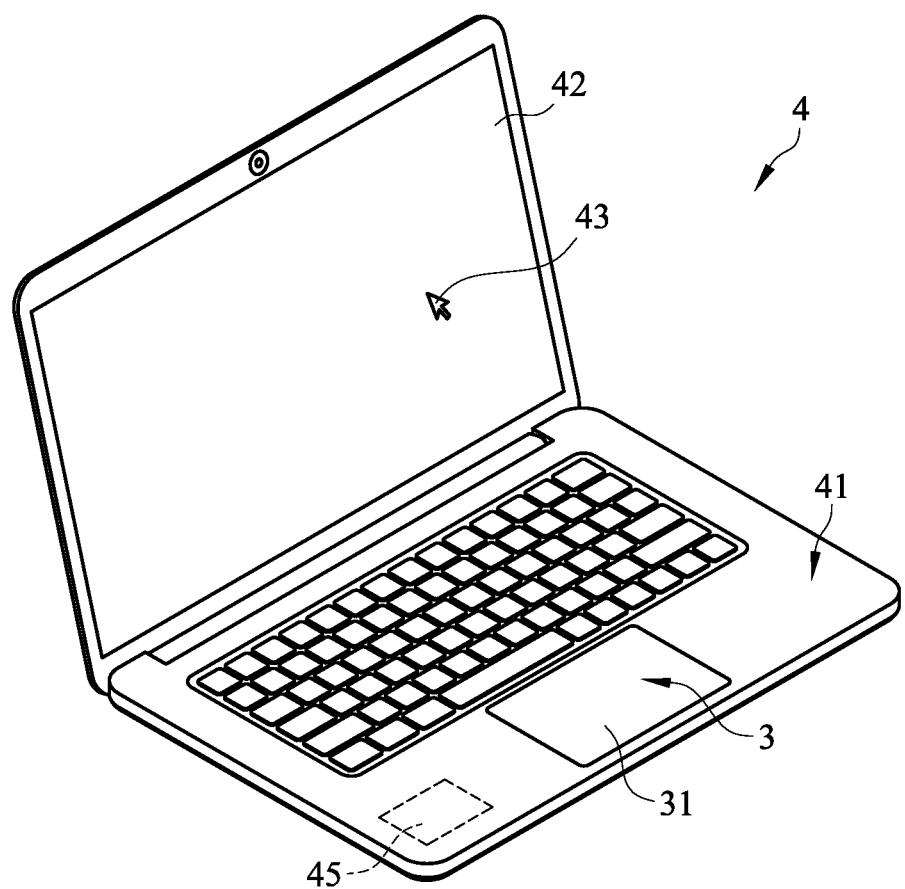
FIG. 6 is a schematic perspective view illustrating the outer appearance of a computing device with a touchpad module according to an embodiment of the present invention.

FIG. 6 is a schematic perspective view illustrating the outer appearance of a computing device with a touchpad module according to an embodiment of the present invention. An example of the computing device 4 includes but is not limited to a notebook computer. In an embodiment, the computing device 4 comprises a casing 41, a display screen 42, a processor 45 and a touchpad module 3. The processor 45 is disposed within the casing 41. Moreover, the processor 41 is used for processing electronic signals of the computing device 4. Moreover, a fixing frame 44 is concavely formed in the casing 41 (see FIG. 7). The touchpad module 3 is disposed within the fixing frame 44 and electrically connected with the processor 45. In addition, at least a portion of the touchpad module 3 is exposed outside so as to be touched by the user's finger. Consequently, the user may operate the touchpad module 3 to control the computing device 4. For example, in case that the user's finger is placed on the touchpad module 3 and slid on the touchpad module 3, a cursor 43 shown on the display screen 42 is correspondingly moved. Moreover, in case that the touchpad module 3 is pressed by the user's finger, the computing device 4 executes a specified function.

Figure 7:
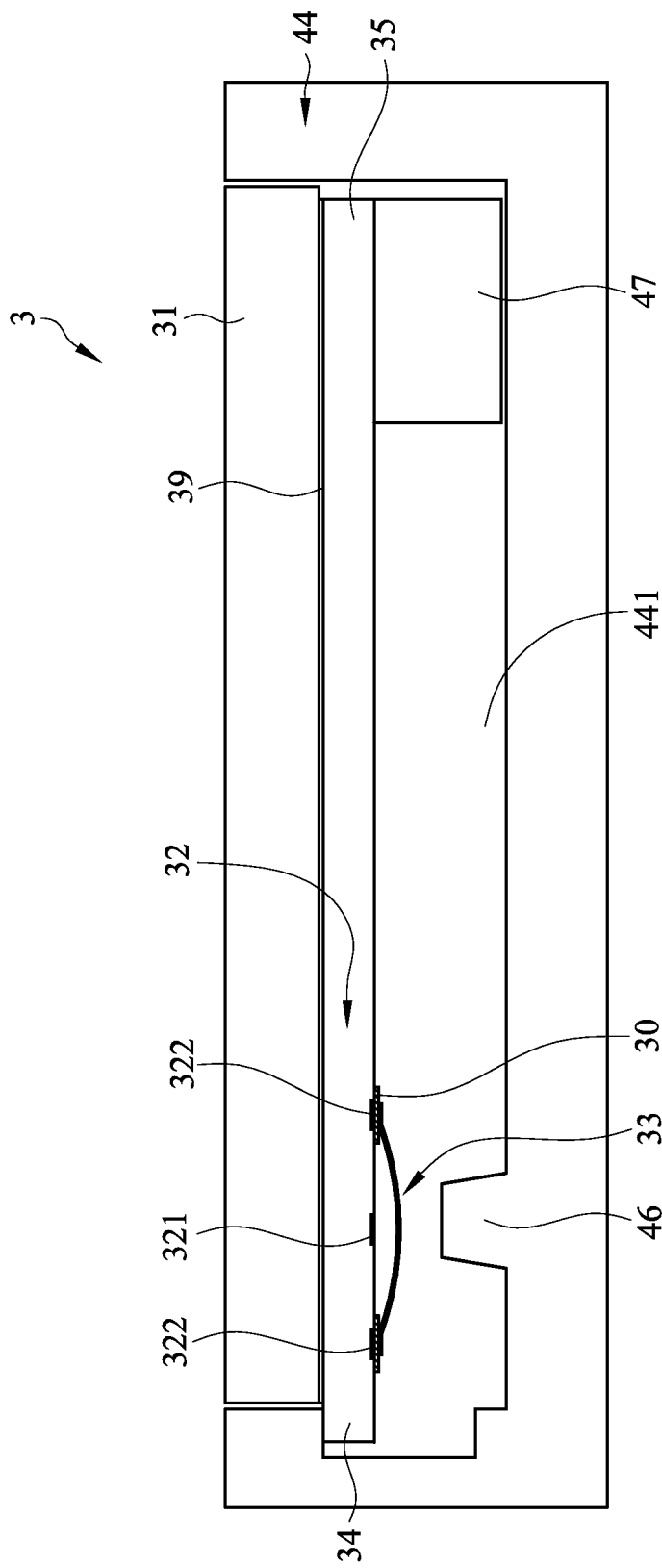
FIG. 7 is a schematic cross-sectional view illustrating portions of a fixing frame and a touchpad module of the computing device as shown in FIG. 6.

FIG. 7 is a schematic cross-sectional view illustrating portions of a fixing frame and a touchpad module of the computing device as shown in FIG. 6. The fixing frame 44 of the computing device 4 comprises an accommodation space 441. The touchpad module 3 is accommodated within the accommodation space 441. From top to bottom, the touchpad assembly 35 comprises a covering plate 31, an adhesive layer 39, a circuit board 32 and a switch 33. The covering plate 31 and the circuit board 32 are combined together through the adhesive layer 39. The switch 33 comprises a metal dome 332. The switch 33 is disposed on a bottom surface of the circuit board 32 and located at a first end 34 of the touchpad module 3. The circuit board 32 comprises a first conducting part 321 and a second conducting part 322. The first conducting part 321 and the second conducting part 322 are not in contact with each other. The first conducting part 321 and the second conducting part 322 are electrically connected with each other through the switch 33. A top surface of the covering plate 31 is exposed outside. Consequently, the covering plate 31 can be touched and operated by the user. When the circuit board 32 senses the touching and operating behavior of the user on the covering plate 31, the circuit board 32 issues a corresponding electronic signal. According to the electronic signal, the computing device 4 executes a corresponding command. Preferably but not exclusively, the covering plate 31 is a glass covering plate or a plastic covering plate, and the adhesive layer 39 is made of a pressure sensitive adhesive (PSA).

The computing device 4 further comprises a triggering part 46 and a supporting structure 47. The triggering part 46 and the supporting structure 47 are disposed on an inner side of the fixing frame 44 and accommodated within the accommodation space 441 of the fixing frame 44. A second end 35 of the touchpad module 3 is disposed on the supporting structure 47. During the process of swinging the first end 34 of the touchpad module 3, the supporting structure 47 is used as a fulcrum. The triggering part 46 is aligned with the switch 33. While the first end 34 of the touchpad module 3 is swung downwardly, the triggering part 46 is contacted with the switch 33. The triggering part 46 is a raised structure or a flat surface. In addition, the triggering part 46 is integrally formed with the fixing frame 44. Alternatively, the triggering part 46 is one of the components within the fixing frame 44.

The other structure of the touchpad module 3 will be described in more details as follows.

Figure 8:
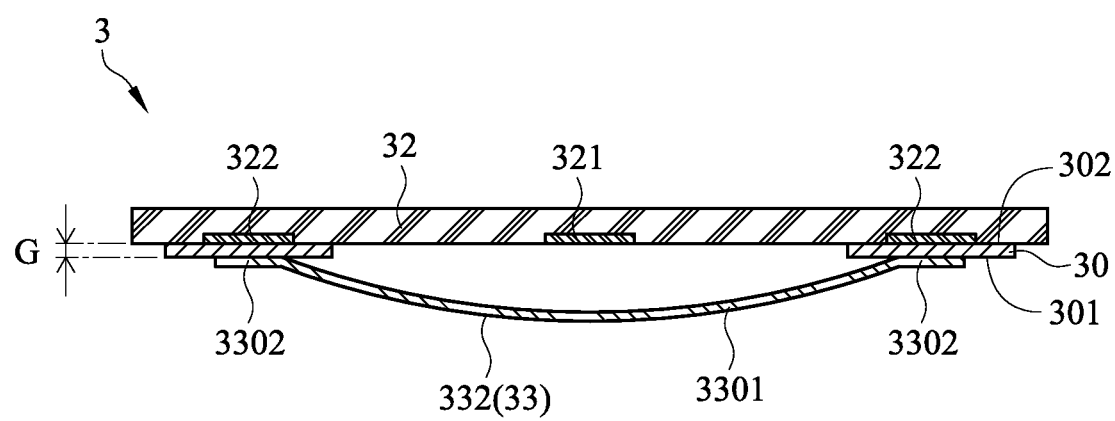
FIG. 8 is a schematic cross-sectional view illustrating the structure of the switch as shown in FIG. 7.

FIG. 8 is a schematic cross-sectional view illustrating the structure of the switch as shown in FIG. 7. In this embodiment, the metal dome 332 comprises a first portion 3301 corresponding to the first conducting part 321 and a second portion 3302 corresponding to the second conducting part 322. The touchpad module 3 further comprises a conductive raised structure 30. The conductive raised structure 30 is disposed on the circuit board 32 and arranged between the second conducting part 322 and the second portion 3302 of the metal dome 332. Since the conductive raised structure 30 is arranged between the second conducting part 322 and the second portion 3302 of the metal dome 332, there is a gap G between the circuit board 32 and the second portion 3302 of the metal dome 332. In an embodiment, the length of gap G is 0.15 millimeter. The length of the gap G is not restricted. Moreover, the conductive raised structure 30 is aligned with the second portion 3302 of the metal dome 332 and the second conducting part 322 of the circuit board 32 only. In addition, the conductive raised structure 30 is not aligned with the first portion 3301 of the metal dome 332 and the first conducting part 321 of the circuit board 32. In other words, the conductive raised structure 30 is not extended to the region between the first portion 3301 of the metal dome 332 and the first conducting part 321 of the circuit board 32.

In this embodiment, the conductive raised structure 30 has a first surface 301 and a second surface 302, which are opposed to each other. The first surface 301 of the conductive raised structure 30 is contacted with the second portion 3302 of the metal dome 332. The second surface 302 of the conductive raised structure 30 is contacted with the second conducting part 322 of the circuit board 32. In accordance with this design, the distance between the metal dome 332 and the circuit board 32 is increased by the conductive raised structure 30, and thus the gap G as shown in FIG. 8 is formed. That is, the length of the gap G is determined according to the thickness of the conductive raised structure 30. In case that the length of gap G is 0.15 millimeter, the thickness of the conductive raised structure 30 is also 0.15 millimeter. It is noted that the thickness of the conductive raised structure 30 is not restricted.

Figure 9:
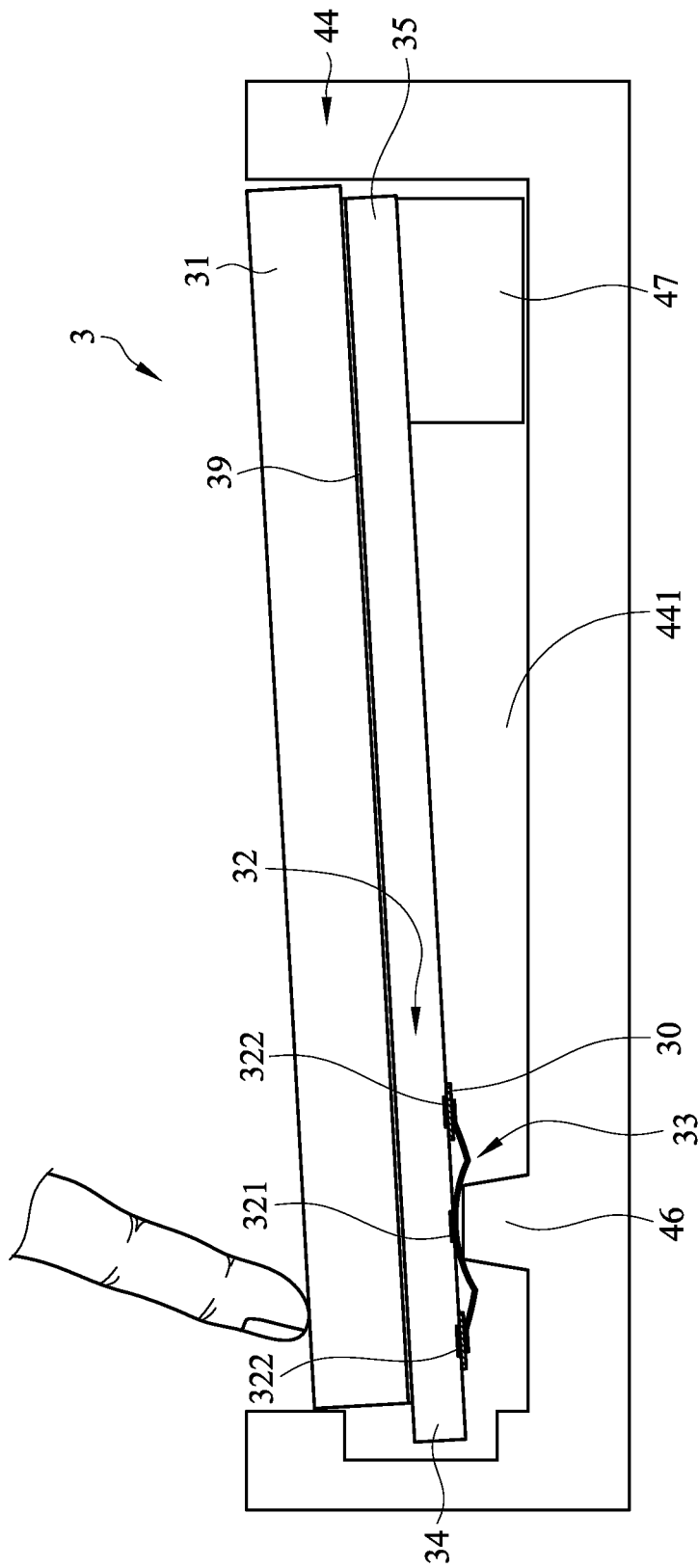
FIG. 9 is a schematic cross-sectional view illustrating portions of the touchpad module and the fixing frame as shown in FIG. 7, in which the touchpad module is pressed down.
Figure 10:
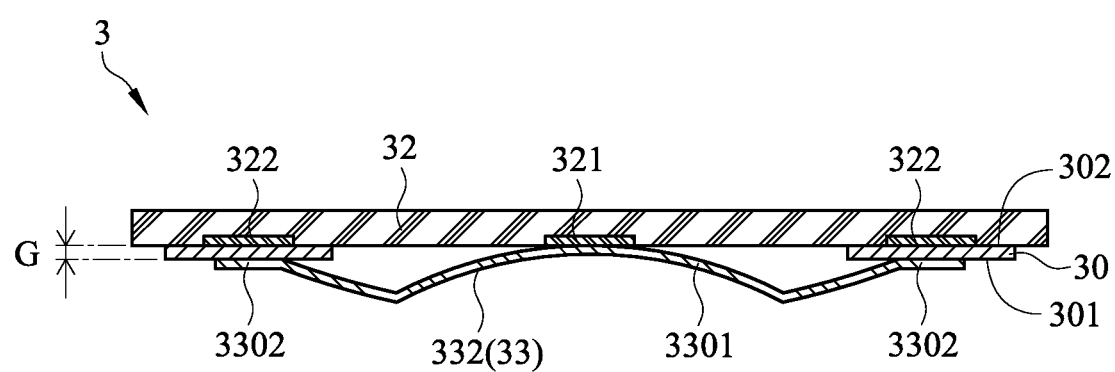
FIG. 10 is a schematic cross-sectional view illustrating the switch as shown in FIG. 9.

Hereinafter, the operations of the touchpad module 3 in response to the depressing action will be described in more details with reference to FIGS. 9 and 10. FIG. 9 is a schematic cross-sectional view illustrating portions of the touchpad module and the fixing frame as shown in FIG. 7, in which the touchpad module is pressed down. FIG. 10 is a schematic cross-sectional view illustrating the switch as shown in FIG. 9.

Please refer to FIG. 9. While the covering plate 31 of the touchpad module 3 is pressed down, the first end 34 of the touchpad module 3 is swung downwardly relative to the triggering part 46 by using the supporting structure 47 as a fulcrum. When the switch 33 is pushed by the triggering part 46, the metal dome 332 of the switch 33 is subjected to deformation. While the metal dome 332 is subjected to deformation, the first portion 3301 of the metal dome 332 is contacted with the first conducting part 321 of the circuit board 32 and the second portion 3302 of the metal dome 332 is contacted with the conductive raised structure 30. Since the conductive raised structure 30 is electrically conductive, the electric connection between the first conducting part 321 and the second conducting part 322 of the circuit board 32 is established and the switch 33 is triggered. At the same time, the circuit board 32 electrically connected with the switch 33 issues a corresponding electronic signal to the computing device 4. According to the electronic signal, the computing device 4 executes a corresponding function.

As mentioned above, the distance between the metal dome 332 of the switch 33 and the circuit board 32 is increased by the conductive raised structure 30, and thus the gap G is formed between the second portion 3302 of the metal dome 332 of the metal dome 332 and the circuit board 32. While the touchpad module 3 is pressed down and the metal dome 332 is subjected to deformation, the first portion 3301 of the metal dome 332 can be contacted with the first conducting part 321 of the circuit board 32. More especially, the contact area between the metal dome 332 and the circuit board 32 is reduced. Since the collision between the metal dome 332 and the circuit board 32 is alleviated, the generated noise is reduced. In such way, the comfort of operating the touchpad module 3 is enhanced.

In an embodiment, the gap G created by the conductive raised structure 30 and arranged between the second portion 3302 of the metal dome 332 of the metal dome 332 and the circuit board 32 is 0.15 millimeter. In some other embodiment, the gap G is in the range between 0.1 millimeter and 0.5 millimeter. That is, the thickness of the conductive raised structure 30 is in the range between 0.1 millimeter and 0.5 millimeter according to the practical requirements. The conductive raised structure 30 with the proper thickness is helpful to reduce collision between the metal dome 332 and the circuit board 32 and increase the comfort of operating the touchpad module 3.

In an embodiment, the conductive raised structure 30 is made of an adhesive material. For example, the conductive raised structure 30 is a pressure sensitive adhesive (PSA), conductive silicone structure, an anisotropic conductive film (ACF), a thermosetting conductive double-sided adhesive, or the like. It is noted that the material of the conductive raised structure 30 is not restricted. For example, in another embodiment, the conductive raised structure 30 is made of a soft conducive material. Preferably but not exclusively, the soft conducive material is conducive non-woven fabric.

Figure 11:
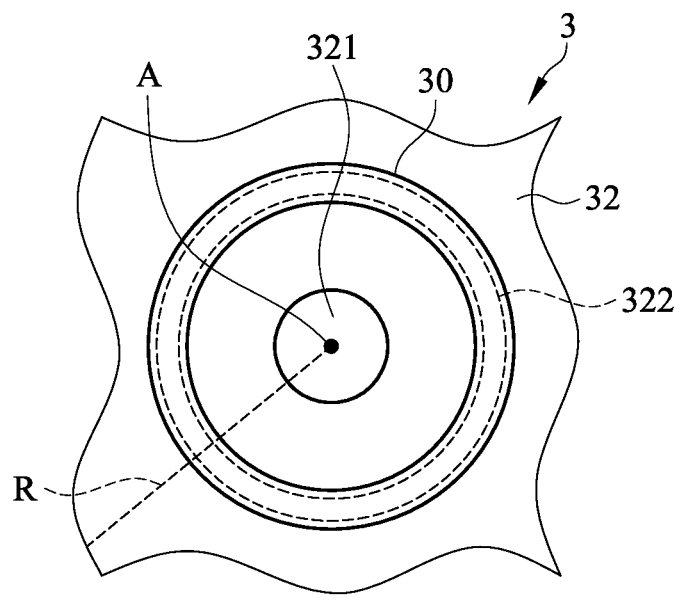
FIG. 11 is a schematic top view illustrating the structure of the switch as shown in FIG. 8.

FIG. 11 is a schematic top view illustrating the structure of the switch as shown in FIG. 8. As shown in FIG. 11, the first conducting part 321 and the second conducting part 322 of the circuit board 32 are coaxially arranged around an axial center A of the circuit board 32 along a radial direction R. In this embodiment, the first conducting part 321 has a closed circle shape, and the second conducting part 322 has a closed ring shape. Moreover, the second conducting part 322 is arranged around the first conducting part 321. Similarly, the conductive raised structure 30 also has the closed ring shape. The second conducting part 322 of the circuit board 32 is covered by the conductive raised structure 30. The examples of the first conducting part 321, the second conducting part 322 and the conductive raised structure 30 are presented herein for illustration only. It is noted that the structures of the first conducting part 321, the second conducting part 322 and the conductive raised structure 30 are not restricted and may be varied according to the practical requirements. In case that the strength of the conductive raised structure 30 is sufficient to form the gap G between the second portion 3302 of the metal dome 332 of the metal dome 332, it is not necessary to completely cover conductive raised structure 30 on the second conducting part 322 of the circuit board 32.

Figure 12:
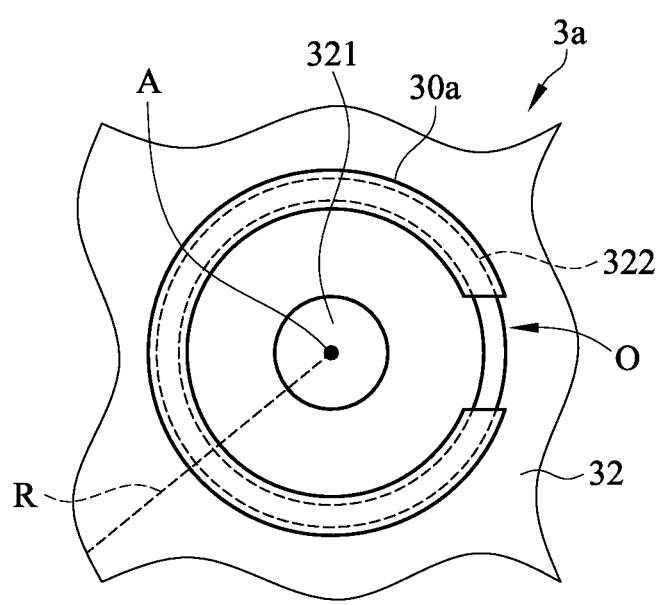
FIG. 12 is a schematic top view illustrating a portion of the touchpad module according to another embodiment of the present invention.

FIG. 12 is a schematic top view illustrating a portion of the touchpad module according to another embodiment of the present invention. In comparison with the touchpad module 3 as shown in FIGS. 6-11, the conductive raised structure 30a of the touchpad module 3a of this embodiment and shown in FIG. 12 is a ring-shaped structure with at least one opening O. That is, the conductive raised structure 30a is a C-shaped structure. A portion of the second conducting part 322 of the circuit board 32 is exposed outside the opening O of the conductive raised structure 30a. The conductive raised structure 30a with the at least one opening O is presented herein for illustration only. It is noted that the number of the at least one opening O is not restricted. That is, the number of the at least one opening O may be determined according to the practical requirements.

From the above descriptions, the present invention provides the touchpad module and the computing device with the touchpad module. The touchpad module is equipped with the conductive raised structure between the circuit board and the switch. Consequently, the gap between the metal dome of the switch and the circuit board is in the range between 0.1 millimeter and 0.5 millimeter. While the touchpad module is pressed down and the metal dome is subjected to deformation, the metal dome can be contacted with the first conducting part of the circuit board. More especially, the contact area between the metal dome and the circuit board is reduced. Since the collision between the metal dome and the circuit board is alleviated, the generated noise is reduced. In such way, the comfort of operating the touchpad module is enhanced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A touchpad module, comprising:
   a circuit board comprising a first conducting part and a second conducting part, wherein the second conducting part is arranged around the first conducting part, and the first conducting part and the second conducting part are not in contact with each other;
   a switch installed on the circuit board, and comprising a metal dome, wherein the metal dome comprises a first portion corresponding to the first conducting part and a second portion corresponding to the second conducting part, wherein when the switch is pushed by a triggering part, the metal dome is subjected to deformation and the first portion of the metal dome is contacted with the first conducting part, so that the first conducting part and the second conducting part are electrically connected with each other; and
   a conductive raised structure, wherein the conductive raised structure is disposed on the circuit board and arranged between the second conducting part and the second portion of the metal dome, so that a gap is formed between the circuit board and the second portion of the metal dome, wherein the gap is in a range between 0.1 millimeter and 0.5 millimeter.

2. The touchpad module according to claim 1, wherein the gap between the circuit board and the second portion of the metal dome is 0.15 millimeter.

3. The touchpad module according to claim 1, wherein the conductive raised structure is made of an adhesive material, wherein the adhesive material is a pressure sensitive adhesive, a conductive silicone, an anisotropic conductive film or a thermosetting conductive double-sided adhesive.

4. The touchpad module according to claim 1, wherein the conductive raised structure is made of a soft conducive material, wherein the soft conducive material is conducive non-woven fabric.

5. The touchpad module according to claim 1, wherein the first conducting part and the second conducting part of the circuit board are coaxially arranged around an axial center of the circuit board along a radial direction.

6. The touchpad module according to claim 5, wherein the second conducting part is covered by the conductive raised structure, and the conductive raised structure has a closed ring shape.

7. The touchpad module according to claim 5, wherein the second conducting part is covered by the conductive raised structure, and the conductive raised structure has a ring shape with at least one opening, wherein a portion of the second conducting part is exposed outside the at least one opening.

8. The touchpad module according to claim 1, wherein the conductive raised structure has a first surface and a second surface, which are opposed to each other, wherein the first surface of the conductive raised structure is contacted with the second portion of the metal dome, and the second surface of the conductive raised structure is contacted with the second conducting part of the circuit board.

9. The touchpad module according to claim 1, wherein the touchpad module further comprises a covering plate, and the covering plate is located over the circuit board.

10. The touchpad module according to claim 1, wherein the circuit board, the switch and the conductive raised structure are accommodated within a fixing frame, and the triggering part is disposed on an inner surface of the fixing frame so as to push the switch.

11. A computing device, comprising:
   a casing, wherein a fixing frame is concavely formed in the casing;
   a processor disposed within the casing; and a touchpad module disposed within the casing and electrically connected with the processor, wherein the touchpad module comprises:
  a circuit board comprising a first conducting part and a second conducting part, wherein the second conducting part is arranged around the first conducting part, and the first conducting part and the second conducting part are not in contact with each other;
  a switch installed on the circuit board, and comprising a metal dome, wherein the metal dome comprises a first portion corresponding to the first conducting part and a second portion corresponding to the second conducting part, wherein when the switch is pushed by a triggering part, the metal dome is subjected to deformation and the first portion of the metal dome is contacted with the first conducting part, so that the first conducting part and the second conducting part are electrically connected with each other; and
  a conductive raised structure, wherein the conductive raised structure is disposed on the circuit board and arranged between the second conducting part and the second portion of the metal dome, so that a gap is formed between the circuit board and the second portion of the metal dome, wherein the gap is in a range between 0.1 millimeter and 0.5 millimeter.

12. The computing device according to claim 11, wherein the touchpad module further comprises a covering plate, and the covering plate is located over the circuit board.

13. The computing device according to claim 11, wherein the fixing frame comprises an accommodation space and the triggering part, wherein the triggering part is disposed on an inner surface of the fixing frame, and the circuit board, the switch and the conductive raised structure are accommodated within the accommodation space.

* * * * *